US 8,085,586 B2

(12) United States Patent
Golov et al.

(10) Patent No.: US 8,085,586 B2
(45) Date of Patent: Dec. 27, 2011

(54) WEAR LEVEL ESTIMATION IN ANALOG MEMORY CELLS

(75) Inventors: Oren Golov, Hod-Hasharon (IL); Eyal Gurgi, Petah-Tikva (IL); Dotan Sokolov, Ra'anana (IL); Yoav Kasoria, Seoul (KR); Shai Winter, Givatayim (IL)

(73) Assignee: Anobit Technologies Ltd., Herzliya Pituach (IL)

( * ) Notice: Subject to any disclaimer, the term of this patent is extended or adjusted under 35 U.S.C. 154(b) by 237 days.

(21) Appl. No.: 12/344,233

(22) Filed: Dec. 25, 2008

(65) Prior Publication Data

US 2009/0168524 A1 Jul. 2, 2009

Related U.S. Application Data

(60) Provisional application No. 61/016,816, filed on Dec. 27, 2007, provisional application No. 61/026,211, filed on Feb. 5, 2008, provisional application No. 61/078,780, filed on Jul. 8, 2008.

(51) Int. Cl.
*G11C 16/04* (2006.01)

(52) U.S. Cl. .......... 365/185.03; 365/185.19; 365/185.22

(58) Field of Classification Search ............. 365/185.17, 365/185.03, 185.28, 185.16, 45, 191, 185.19, 365/185.22

See application file for complete search history.

(56) References Cited

U.S. PATENT DOCUMENTS

| | | | |
|---|---|---|---|
| 4,556,961 A | 12/1985 | Iwahashi et al. | |
| 4,558,431 A | 12/1985 | Satoh | |
| 4,661,929 A | 4/1987 | Aoki et al. | |
| 4,768,171 A | 8/1988 | Tada | |
| 4,811,285 A | 3/1989 | Walker et al. | |
| 4,899,342 A | 2/1990 | Potter et al. | |
| 4,910,706 A | 3/1990 | Hyatt | |
| 4,993,029 A | 2/1991 | Galbraith et al. | |
| 5,056,089 A | 10/1991 | Furuta et al. | |
| 5,077,722 A | 12/1991 | Geist et al. | |
| 5,126,808 A | 6/1992 | Montalvo et al. | |
| 5,163,021 A | 11/1992 | Mehrotra et al. | |
| 5,172,338 A | 12/1992 | Mehrotta et al. | |
| 5,191,584 A | 3/1993 | Anderson | |
| 5,200,959 A | 4/1993 | Gross et al. | |

(Continued)

FOREIGN PATENT DOCUMENTS

EP 0783754 B1 7/1997

(Continued)

OTHER PUBLICATIONS

Hong et al., "NAND Flash-based Disk Cache Using SLC/MLC Combined Flash Memory", 2010 International Workshop on Storage Network Architecture and Parallel I/Os, pp. 21-30, USA, May 3, 2010.

(Continued)

*Primary Examiner* — Anh Phung
*Assistant Examiner* — Hien Nguyen
(74) *Attorney, Agent, or Firm* — D. Kligler I.P. Services Ltd.

(57) ABSTRACT

A method for operating a memory includes applying at least one pulse to a group of analog memory cells, so as to cause the memory cells in the group to assume respective storage values. After applying the pulse, the respective storage values are read from the memory cells in the group. One or more statistical properties of the read storage values are computed. A wear level of the group of the memory cells is estimated responsively to the statistical properties.

18 Claims, 2 Drawing Sheets

U.S. PATENT DOCUMENTS

| | | |
|---|---|---|
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koning |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,969,986 A | 10/1999 | Wong et al. |
| 5,991,517 A | 11/1999 | Harari et al. |
| 5,995,417 A | 11/1999 | Chen et al. |
| 6,009,014 A | 12/1999 | Hollmer et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,166,962 A | 12/2000 | Chen et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,275,419 B1 | 8/2001 | Guterman et al. |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,396,742 B1 | 5/2002 | Korsh et al. |
| 6,397,364 B1 | 5/2002 | Barkan |
| 6,405,323 B1 | 6/2002 | Lin et al. |
| 6,418,060 B1 | 7/2002 | Yong et al. |
| 6,442,585 B1 | 8/2002 | Dean et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,558,967 B1 | 5/2003 | Wong |
| 6,560,152 B1 | 5/2003 | Cernea |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzalez et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,807,095 B2 | 10/2004 | Chen et al. |
| 6,809,964 B2 | 10/2004 | Moschopoulos et al. |
| 6,829,167 B2 | 12/2004 | Tu et al. |
| 6,845,052 B1 | 1/2005 | Ho et al. |
| 6,851,018 B2 | 2/2005 | Wyatt et al. |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,894,926 B2 | 5/2005 | Guterman et al. |
| 6,907,497 B2 | 6/2005 | Hosono et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 7,002,843 B2 | 2/2006 | Guterman et al. |
| 7,012,835 B2 | 3/2006 | Gonzalez et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,039,846 B2 | 5/2006 | Hewitt et al. |
| 7,042,766 B1 | 5/2006 | Wang et al. |
| 7,054,193 B1 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,071,849 B2 | 7/2006 | Zhang |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,151,692 B2 | 12/2006 | Wu |
| 7,170,802 B2 | 1/2007 | Cernea et al. |
| 7,173,859 B2 | 2/2007 | Hemink |
| 7,177,184 B2 | 2/2007 | Chen |

| | | |
|---|---|---|
| 7,177,195 B2 | 2/2007 | Gonzalez et al. |
| 7,177,199 B2 | 2/2007 | Chen et al. |
| 7,177,200 B2 | 2/2007 | Ronen et al. |
| 7,184,338 B2 | 2/2007 | Nakagawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,928 B2 | 3/2007 | Chen |
| 7,197,594 B2 | 3/2007 | Raz et al. |
| 7,200,062 B2 | 4/2007 | Kinsely et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,257,027 B2 | 8/2007 | Park |
| 7,259,987 B2 | 8/2007 | Chen et al. |
| 7,266,026 B2 | 9/2007 | Gongwer et al. |
| 7,274,611 B2 | 9/2007 | Roohparvar |
| 7,277,355 B2 | 10/2007 | Tanzawa |
| 7,280,398 B1 | 10/2007 | Lee et al. |
| 7,280,409 B2 | 10/2007 | Misumi et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,272 B1 | 12/2007 | Mokhlesi et al. |
| 7,310,347 B2 | 12/2007 | Lasser |
| 7,321,509 B2 | 1/2008 | Chen et al. |
| 7,342,831 B2 | 3/2008 | Mokhlesi et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,388,781 B2 | 6/2008 | Litsyn et al. |
| 7,397,697 B2 | 7/2008 | So et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,420,847 B2 | 9/2008 | Li |
| 7,433,231 B2 | 10/2008 | Aritome |
| 7,437,498 B2 | 10/2008 | Ronen |
| 7,440,324 B2 | 10/2008 | Mokhlesi |
| 7,441,067 B2 | 10/2008 | Gorobetz et al. |
| 7,453,737 B2 | 11/2008 | Ha |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 | 12/2008 | Lutze et al. |
| 7,471,581 B2 | 12/2008 | Tran et al. |
| 7,492,641 B2 | 2/2009 | Hosono et al. |
| 7,508,710 B2 | 3/2009 | Mokhlesi |
| 7,539,062 B2 | 5/2009 | Doyle |
| 7,551,492 B2 | 6/2009 | Kim |
| 7,568,135 B2 | 7/2009 | Cornwell et al. |
| 7,570,520 B2 | 8/2009 | Kamei et al. |
| 7,593,259 B2 | 9/2009 | Kim |
| 7,596,707 B1 | 9/2009 | Vemula |
| 7,631,245 B2 | 12/2009 | Lasser |
| 7,633,798 B2 | 12/2009 | Sarin et al. |
| 7,633,802 B2 | 12/2009 | Mokhlesi |
| 7,656,734 B2 | 2/2010 | Thorp et al. |
| 7,660,158 B2 | 2/2010 | Aritome |
| 7,660,183 B2 | 2/2010 | Ware et al. |
| 7,742,351 B2 | 6/2010 | Inoue et al. |
| 7,761,624 B2 | 7/2010 | Karamchetti et al. |
| 7,810,017 B2 | 10/2010 | Radke |
| 7,848,149 B2 | 12/2010 | Gonzalez et al. |
| 7,885,119 B2 | 2/2011 | Li |
| 7,925,936 B1 * | 4/2011 | Sommer .................. 714/704 |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0118574 A1 | 8/2002 | Gongwer et al. |
| 2002/0133684 A1 | 9/2002 | Anderson |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0086574 A1 | 4/2005 | Fackenthal |
| 2005/0121436 A1 | 6/2005 | Kamitani et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |

| | | | | | | |
|---|---|---|---|---|---|---|
| 2007/0171714 A1 | 7/2007 | Wu et al. | | 2009/0300227 A1 | 12/2009 | Nochimowski et al. |
| 2007/0183210 A1 | 8/2007 | Choi et al. | | 2009/0323412 A1 | 12/2009 | Mokhlesi et al. |
| 2007/0189073 A1 | 8/2007 | Aritome | | 2009/0327608 A1 | 12/2009 | Eschmann |
| 2007/0195602 A1 | 8/2007 | Fong et al. | | 2010/0017650 A1 | 1/2010 | Chin et al. |
| 2007/0206426 A1 | 9/2007 | Mokhlesi | | 2010/0034022 A1 | 2/2010 | Dutta et al. |
| 2007/0208904 A1 | 9/2007 | Hsieh et al. | | 2010/0057976 A1 | 3/2010 | Lasser |
| 2007/0226599 A1 | 9/2007 | Motwani | | 2010/0061151 A1 | 3/2010 | Miwa et al. |
| 2007/0236990 A1 | 10/2007 | Aritome | | 2010/0110580 A1 | 5/2010 | Takashima |
| 2007/0253249 A1 | 11/2007 | Kang et al. | | 2010/0131697 A1 | 5/2010 | Alrod et al. |
| 2007/0256620 A1 | 11/2007 | Viggiano et al. | | 2010/0142268 A1 | 6/2010 | Aritome |
| 2007/0263455 A1 | 11/2007 | Cornwell et al. | | 2010/0142277 A1 | 6/2010 | Yang et al. |
| 2007/0266232 A1 | 11/2007 | Rodgers et al. | | 2010/0169743 A1 | 7/2010 | Vogan et al. |
| 2007/0271424 A1 | 11/2007 | Lee et al. | | | | |
| 2007/0280000 A1 | 12/2007 | Fujiu et al. | | | | |
| 2007/0291571 A1 | 12/2007 | Balasundaram | | | | |
| 2007/0297234 A1 | 12/2007 | Cernea et al. | | | | |
| 2008/0010395 A1 | 1/2008 | Mylly et al. | | | | |
| 2008/0025121 A1 | 1/2008 | Tanzawa | | | | |
| 2008/0043535 A1 | 2/2008 | Roohparvar | | | | |
| 2008/0049504 A1 | 2/2008 | Kasahara et al. | | | | |
| 2008/0049506 A1 | 2/2008 | Guterman | | | | |
| 2008/0052446 A1 | 2/2008 | Lasser et al. | | | | |
| 2008/0055993 A1 | 3/2008 | Lee | | | | |
| 2008/0080243 A1 | 4/2008 | Edahiro et al. | | | | |
| 2008/0082730 A1 | 4/2008 | Kim et al. | | | | |
| 2008/0089123 A1 | 4/2008 | Chae et al. | | | | |
| 2008/0104309 A1 | 5/2008 | Cheon et al. | | | | |
| 2008/0104312 A1 | 5/2008 | Lasser | | | | |
| 2008/0109590 A1 | 5/2008 | Jung et al. | | | | |
| 2008/0115017 A1 | 5/2008 | Jacobson | | | | |
| 2008/0123420 A1 | 5/2008 | Brandman et al. | | | | |
| 2008/0126686 A1 | 5/2008 | Sokolov et al. | | | | |
| 2008/0130341 A1 | 6/2008 | Shalvi et al. | | | | |
| 2008/0148115 A1 | 6/2008 | Sokolov et al. | | | | |
| 2008/0151618 A1 | 6/2008 | Sharon et al. | | | | |
| 2008/0151667 A1 | 6/2008 | Miu et al. | | | | |
| 2008/0158958 A1 | 7/2008 | Sokolov et al. | | | | |
| 2008/0181001 A1 | 7/2008 | Shalvi | | | | |
| 2008/0198650 A1 | 8/2008 | Shalvi et al. | | | | |
| 2008/0198654 A1 | 8/2008 | Toda | | | | |
| 2008/0209116 A1 | 8/2008 | Caulkins | | | | |
| 2008/0209304 A1 | 8/2008 | Winarski et al. | | | | |
| 2008/0215798 A1 | 9/2008 | Sharon et al. | | | | |
| 2008/0219050 A1 | 9/2008 | Shalvi et al. | | | | |
| 2008/0239093 A1 | 10/2008 | Easwar et al. | | | | |
| 2008/0239812 A1 | 10/2008 | Abiko et al. | | | | |
| 2008/0253188 A1 | 10/2008 | Aritome | | | | |
| 2008/0263262 A1 | 10/2008 | Sokolov et al. | | | | |
| 2008/0270730 A1 | 10/2008 | Lasser et al. | | | | |
| 2008/0282106 A1 | 11/2008 | Shalvi et al. | | | | |
| 2009/0013233 A1 | 1/2009 | Radke | | | | |
| 2009/0024905 A1 | 1/2009 | Shalvi et al. | | | | |
| 2009/0034337 A1 | 2/2009 | Aritome | | | | |
| 2009/0043831 A1 | 2/2009 | Antonopoulos et al. | | | | |
| 2009/0043951 A1 | 2/2009 | Shalvi et al. | | | | |
| 2009/0049234 A1 | 2/2009 | Oh et al. | | | | |
| 2009/0073762 A1 | 3/2009 | Lee et al. | | | | |
| 2009/0086542 A1 | 4/2009 | Lee et al. | | | | |
| 2009/0089484 A1 | 4/2009 | Chu | | | | |
| 2009/0091979 A1 | 4/2009 | Shalvi | | | | |
| 2009/0094930 A1 | 4/2009 | Schwoerer | | | | |
| 2009/0106485 A1 | 4/2009 | Anholt | | | | |
| 2009/0112949 A1 | 4/2009 | Ergan et al. | | | | |
| 2009/0132755 A1 | 5/2009 | Radke | | | | |
| 2009/0144600 A1 | 6/2009 | Perlmutter et al. | | | | |
| 2009/0150894 A1 | 6/2009 | Huang et al. | | | | |
| 2009/0157950 A1 | 6/2009 | Selinger | | | | |
| 2009/0157964 A1 | 6/2009 | Kasorla et al. | | | | |
| 2009/0158126 A1 | 6/2009 | Perlmutter et al. | | | | |
| 2009/0168524 A1 | 7/2009 | Golov et al. | | | | |
| 2009/0172257 A1 | 7/2009 | Prins et al. | | | | |
| 2009/0172261 A1 | 7/2009 | Prins et al. | | | | |
| 2009/0199074 A1 | 8/2009 | Sommer et al. | | | | |
| 2009/0204824 A1 | 8/2009 | Lin et al. | | | | |
| 2009/0204872 A1 | 8/2009 | Yu et al. | | | | |
| 2009/0213653 A1 | 8/2009 | Perlmutter et al. | | | | |
| 2009/0213654 A1 | 8/2009 | Perlmutter et al. | | | | |
| 2009/0225595 A1 | 9/2009 | Kim | | | | |
| 2009/0265509 A1 | 10/2009 | Klein | | | | |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |

OTHER PUBLICATIONS

U.S. Appl. No. 11/945,575 Official Action dated Aug. 24, 2010.
U.S. Appl. No. 12/045,520 Official Action dated Nov. 16, 2010.
U.S. Appl. No. 11/995,814 Official Action dated Dec. 17, 2010.
U.S. Appl. No. 12/388,528 Official Action dated Nov. 29, 2010.
U.S. Appl. No. 12/251,471 Official Action dated Jan. 3, 2011.
Engineering Windows 7, "Support and Q&A for Solid-State Drives", e7blog, May 5, 2009.
Micron Technology Inc., "Memory Management in NAND Flash Arrays", Technical Note, year 2005.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Park et al., "Sub-Grouped Superblock Management for High-Performance Flash Storages", IEICE Electronics Express, vol. 6, No. 6, pp. 297-303, Mar. 25, 2009.
"How to Resolve "Bad Super Block: Magic Number Wrong" in BSD", Free Online Articles Director Article Base, posted Sep. 5, 2009.

UBUNTU Forums, "Memory Stick Failed IO Superblock", posted Nov. 11, 2009.
Super User Forums, "SD Card Failure, can't read superblock", posted Aug. 8, 2010.
U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
U.S. Appl. No. 12/019,011 Official Action dated Nov. 20, 2009.
Takeuchi et al., "A Multipage Cell Architecture for High-Speed Programming Multilevel NAND Flash Memories", IEEE Journal of Solid State Circuits, vol. 33, No. 8, Aug. 1998.
JEDEC Standard JESD84-C44, "Embedded MultiMediaCard (e•MMC) Mechanical Standard, with Optional Reset Signal", Jedec Solid State Technology Association, USA, Jul. 2009.
JEDEC, "UFS Specification", version 0.1, Nov. 11, 2009.
SD Group and SD Card Association, "SD Specifications Part 1 Physical Layer Specification", version 3.01, draft 1.00, Nov. 9, 2009.
Compaq et al., "Universal Serial Bus Specification", revision 2.0, Apr. 27, 2000.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
U.S. Appl. No. 12/534,898 Official Action dated Mar. 23, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed Jun. 24, 2010.
Agrell et al., "Closest Point Search in Lattices", IEEE Transactions on Information Theory, vol. 48, No. 8, pp. 2201-2214, Aug. 2002.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May 1984, section 3.2, pp. 47-48.
Chang, L., "Hybrid Solid State Disks: Combining Heterogeneous NAND Flash in Large SSDs", ASPDAC, Jan. 2008.
Cho et al., "Multi-Level Nand Flash Memory with Non-Uniform Threshold Voltage Distribution," IEEE International Solid-State Circuits Conference (ISSCC), San Francisco, CA, Feb. 5-7, 2001, pp. 28-29 and 424.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USa, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.
Engh et al., "A self adaptive programming method with 5 mV accuracy for multi-level storage in Flash", pp. 115-118, Proceedings of the IEEE 2002 Custom Integrated Circuits Conference, May 12-15, 2002.
Goodman et al., "On-Chip ECC for Multi-Level Random Access Memories," Proceedings of the IEEE/CAM Information Theory Workshop, Ithaca, USA, Jun. 25-29, 1989.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.
Horstein, "On the Design of Signals for Sequential and Nonsequential Detection Systems with Feedback," IEEE Transactions on Information Theory IT-12:4 (Oct. 1966), pp. 448-455.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.
Kawaguchi et al. 1995. A flash-memory based file system. In Proceedings of the USENIX 1995 Technical Conference, New Orleans, Louisiana. 155-164.
Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.
Lee et al., "Effects of Floating Gate Interference on NAND Flash Memory Cell Operation", IEEE Electron Device Letters, vol. 23, No. 5, pp. 264-266, May 2002.
Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.
Mielke et al., "Recovery Effects in the Distributed Cycling of Flash Memories", IEEE 44th Annual International Reliability Physics Symposium, pp. 29-35, San Jose, USA, Mar. 2006.
Onfi, "Open NAND Flash Interface Specification," revision 1.0, Dec. 28, 2006.
Phison Electronics Corporation, "PS8000 Controller Specification (for SD Card)", revision 1.2, Document No. S-07018, Mar. 28, 2007.
Shalvi, et al., "Signal Codes," Proceedings of the 2003 IEEE Information Theory Workshop (ITW'2003), Paris, France, Mar. 31-Apr. 4, 2003.
Shiozaki, A., "Adaptive Type-II Hybrid Broadcast ARQ System", IEEE Transactions on Communications, vol. 44, Issue 4, pp. 420-422, Apr. 1996.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.
St Microelectronics, "Bad Block Management in NAND Flash Memories", Application note AN-1819, Geneva, Switzerland, May 2004.
St Microelectronics, "Wear Leveling in Single Level Cell NAND Flash Memories," Application note AN-1822 Geneva, Switzerland, Feb. 2007.
Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.
Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Patentability report dated Mar. 26, 2009.
International Application PCT/IL2007/000575 Search Report dated May 30, 2008.
International Application PCT/IL2007/000576 Patentability Report dated Mar. 19, 2009.
International Application PCT/IL2007/000576 Search Report dated Jul. 7, 2008.
International Application PCT/IL2007/000579 Patentability report dated Mar. 10, 2009.
International Application PCT/IL2007/000579 Search report dated Jul. 3, 2008.
International Application PCT/IL2007/000580 Patentability Report dated Mar. 10, 2009.
International Application PCT/IL2007/000580 Search Report dated Sep. 11, 2008.
International Application PCT/IL2007/000581 Patentability Report dated Mar. 26, 2009.

International Application PCT/IL2007/000581 Search Report dated Aug. 25, 2008.
International Application PCT/IL2007/001059 Patentability report dated Apr. 19, 2009.
International Application PCT/IL2007/001059 Search report dated Aug. 7, 2008.
International Application PCT/IL2007/001315 search report dated Aug. 7, 2008.
International Application PCT/IL2007/001315 Patentability Report dated May 5, 2009.
International Application PCT/IL2007/001316 Search report dated Jul. 22, 2008.
International Application PCT/IL2007/001316 Patentability Report dated May 5, 2009.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
Sommer, N., U.S. Appl. No. 12/171,797 "Memory Device with Non-Uniform Programming Levels" filed Jul. 11, 2008.
Shalvi et al., U.S. Appl. No. 12/251,471 "Compensation for Voltage Drifts in Analog Memory Cells" filed Oct. 15, 2008.
U.S. Appl. No. 11/949,135 Official Action dated Oct. 2, 2009.
U.S. Appl. No. 12/880,101 "Reuse of Host Hibernation Storage Space by Memory Controller", filed Sep. 12, 2010.
U.S. Appl. No. 12/890,724 "Error Correction Coding Over Multiple Memory Pages", filed Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010 .
CN Patent Application # 200780026181.3 Official Action dated Apr. 8, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
Wei, L. "Trellis-Coded Modulation With Multidimensional Constellations", IEEE Transactions on Information Theory, vol. IT-33, No. 4, pp. 483-501, Jul. 1987.
U.S. Appl. No. 13/114,049 Official Action dated Sep. 12, 2011.
U.S. Appl. No. 12/405,275 Official Action dated Jul. 29, 2011.
US 7,161,836, 01/2007, Wan et al. (withdrawn)

* cited by examiner

WEAR LEVEL ESTIMATION IN ANALOG MEMORY CELLS

CROSS-REFERENCE TO RELATED APPLICATIONS

This application claims the benefit of U.S. Provisional Patent Application 61/016,816, filed Dec. 27, 2007, U.S. Provisional Patent Application 61/026,211, filed Feb. 5, 2008, and U.S. Provisional Patent Application 61/078,780, filed Jul. 8, 2008, whose disclosures are incorporated herein by reference.

FIELD OF THE INVENTION

The present invention relates generally to memory devices, and particularly to methods and systems for estimating wear levels of analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory", Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs", Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories", Proceedings of the 24$^{th}$ International Conference on Microelectronics (MIEL), Nis, Serbia and Montenegro, May 16-19, 2004, volume 1, pages 377-384, which is incorporated herein by reference.

The performance of some types of analog memory cells deteriorates as a function of use (e.g., as a function of the number of Programming and Erasure (P/E) cycles applied to the cells). This property is sometimes referred to as cell wearing. Some data storage techniques attempt to distribute cell wearing evenly among different groups of memory cells. These techniques are commonly referred to as wear leveling techniques.

For example, U.S. Patent Application Publication 2007/0050536, whose disclosure is incorporated herein by reference, describes a system comprising a non-volatile memory, a controller and a wear leveling table. The non-volatile memory includes one or more memory blocks to store data. The controller allocates one or more of the memory blocks to store data. The wear-leveling table is populated with pointers to unallocated memory blocks in the non-volatile memory. The controller identifies one or more pointers in the wear-leveling table and allocates the unallocated memory blocks associated with the identified pointers for the storage of data.

U.S. Patent Application Publication 2006/0203546, whose disclosure is incorporated herein by reference, describes a method of achieving wear leveling in a Flash memory. For each block of the memory, a number is calculated that is a function of the number of times the block has been erased and of the number of times at least one other block has been erased. The numbers are stored in a memory device that includes the memory. The numbers are updated as needed when blocks are erased. Blocks are selected to be erased in accordance with their numbers.

PCT International Publication WO 2008/077284, whose disclosure is incorporated herein by reference, describes a wear leveling method for non-volatile memory. An embodiment includes counting erase cycles for each of a set of multiple memory blocks of a non-volatile memory, including incrementing a first count for a physical block address of the memory block. If the memory block is not a spare memory block, a second count for a logical block address of the memory block is incremented. The method also determines whether the memory has uneven wear of memory blocks based on the counting of the erase cycles of the plurality of memory blocks.

U.S. Patent Application Publication 2007/0208904, whose disclosure is incorporated herein by reference, describes a wear leveling apparatus, which uniformly distributes wear over a nonvolatile memory containing a plurality of memory blocks. The apparatus includes a memory unit for storing a record of cold block candidates in the nonvolatile memory and a control unit configured to update the memory unit and release the cold block candidates under a threshold condition. The control unit selects a new memory block to replace one cold block candidate in the memory unit when the cold block candidate is matched with a written address in a write command for the nonvolatile memory. The cold block candidates remaining in the memory unit are identified as cold blocks when the nonvolatile memory has been written more than a predetermined write count threshold. The memory blocks with infrequent erasure can be identified and released to uniformly distribute wear over the nonvolatile memory.

U.S. Pat. No. 6,230,233, whose disclosure is incorporated herein by reference, describes a mass storage system made of Flash memory cells organized into blocks, the blocks in turn being grouped into memory banks. The system is managed to even out the numbers of erase and rewrite cycles experienced by the memory banks in order to extend the service lifetime of the system. Relative use of the memory banks is monitored and, in response to detection of uneven use, memory banks have their physical addresses periodically swapped for each other in order to even out their use over the lifetime of the memory.

U.S. Pat. No. 7,441,067, whose disclosure is incorporated herein by reference, describes a re-programmable non-volatile memory system, such as a Flash system, having its memory cells grouped into blocks of cells that are simultaneously erasable. The system is operated in a manner to level out the wear of the individual blocks through repetitive erasing and re-programming. Wear leveling may be accomplished without use of counts of the number of times the individual blocks experience erase and re-programming but such counts can optionally aid in carrying out the wear leveling process. Individual active physical blocks are chosen to be exchanged with those of an erased block pool in a predefined order.

U.S. Pat. No. 7,453,737, whose disclosure is incorporated herein by reference, describes a non-volatile memory device and programming process. The programming process increases the programming voltage of successive programming cycles in relation to the percentage of the data bits that failed programming verification during the previous programming cycle and were not correctly programmed into the memory array.

SUMMARY OF THE INVENTION

An embodiment of the present invention provides a method for operating a memory, the method including:

applying at least one pulse to a group of analog memory cells so as to cause the memory cells in the group to assume respective storage values;

after applying the pulse, reading the respective storage values from the memory cells in the group;

computing one or more statistical properties of the read storage values; and estimating a wear level of the group of the memory cells responsively to the statistical properties.

In some embodiments, estimating the wear level includes estimating a number of Programming and Erasure (P/E) cycles that were previously applied to the group of the memory cells. Estimating the wear level may include predefining a mapping between values of the statistical properties and respective wear levels, and determining the wear level that best matches the computed statistical properties according to the predefined mapping. In an embodiment, computing the statistical properties includes calculating at least one property selected from a group of properties consisting of a mean and a variance of the read storage values.

In a disclosed embodiment, the method includes storing data in the group of the analog memory cells by applying a sequence of Programming and Verification (P&V) operations to the memory cells in the group, applying the pulse includes applying a first programming operation in the sequence, and reading the storage values includes applying a first verification operation in the sequence. In another embodiment, estimating the wear level includes assessing multiple wear levels of multiple respective groups of the memory cells, and the method includes allocating at least one of the groups for storage of new data responsively to the assessed wear levels.

Additionally or alternatively, the method includes setting one or more parameters related to data storage in the group of the memory cells responsively to the estimated wear level. The parameters may include at least one parameter type selected from a group of types consisting of a read threshold, a verify threshold, an initial pulse amplitude of a sequence of programming pulses that are used for storing data in the memory cells, and an increment between successive programming pulses in the sequence of the programming pulses.

In some embodiments, the method includes setting a data storage density in the group of the memory cells responsively to the estimated wear level. Setting the data storage density may include selecting at least one property selected from a group of properties consisting of a number of programming levels and an Error Correction Code (ECC) used for data storage in the group.

In an embodiment, the method includes exchanging a message related to estimation of the wear level over an interface between the memory and a memory controller. Exchanging the message may include sending from the memory controller to the memory a command, which instructs the memory to apply the pulse. Additionally or alternatively, exchanging the message includes reporting the computed statistical properties from the memory to the memory controller. Further additionally or alternatively, exchanging the message may include reporting the estimated wear level from the memory to the memory controller.

In some embodiments, applying the at least one pulse includes applying one or more erasure pulses so as to cause at least some of the memory cells in the group to assume negative storage values.

Computing the statistical properties may include assessing a portion of the memory cells in the group that have assumed the negative storage values responsively to a given number of the erasure pulses. Additionally or alternatively, computing the statistical properties includes counting the erasure pulses needed to cause a given portion of the memory cells in the group to assume the negative storage values. Further additionally or alternatively, computing the statistical properties includes comparing the statistical properties before and after applying a given number of the erasure pulses.

In a disclosed embodiment, computing the statistical properties includes calculating the statistical properties for a subset of the memory cells in the group, which are initially programmed to a given programming level. In some embodiments, the memory cells in the group belong to a given word line, and reading the storage values includes causing at least some of the negative storage values to become positive by programming other memory cells, which belong to one or more word lines that neighbor the given word line.

There is additionally provided, in accordance with an embodiment of the present invention, a method for operating a memory, the method including:

predefining an action to be applied to one or more groups of analog memory cells in response to respective wear levels of the groups;

applying at least one pulse to a given group of the analog memory cells so as to cause the memory cells in the given group to assume respective storage values;

after applying the pulse, reading the respective storage values from the memory cells in the given group;

computing one or more statistical properties of the read storage values, which are indicative of a wear level of the memory cells in the given group; and applying the predefined action responsively to the computed statistical properties.

There is further provided, in accordance with an embodiment of the present invention, apparatus, including:

a memory, which includes multiple analog memory cells; and circuitry, which is coupled to apply at least one pulse to a group of the memory cells so as to cause the memory cells in the group to assume respective storage values, to read the respective storage values from the memory cells in the group after applying the pulse, to compute one or more statistical properties of the read storage values, and to estimate a wear level of the group of the memory cells responsively to the statistical properties.

There is further provided, in accordance with an embodiment of the present invention, apparatus, including:

a memory, which includes multiple analog memory cells; and circuitry, which is coupled to hold a definition of an action to be applied to one or more groups of the memory cells in response to respective wear levels of the groups, to apply at least one pulse to a given group of the memory cells so as to cause the memory cells in the given group to assume respective storage values, to read the respective storage values from the memory cells in the given group after applying the pulse, to compute one or more statistical properties of the read storage values, which are indicative of a wear level of the memory cells in the given group, and to apply the action responsively to the computed statistical properties.

There is also provided, in accordance with an embodiment of the present invention, apparatus, including:

an interface, which is operative to communicate with a memory that includes multiple analog memory cells; and circuitry, which is coupled to apply at least one pulse to a group of the memory cells so as to cause the memory cells in the group to assume respective storage values, to read the respective storage values from the memory cells in the group after applying the pulse, to compute one or more statistical properties of the read storage values, and to estimate a wear level of the group of the memory cells responsively to the statistical properties.

There is additionally provided, in accordance with an embodiment of the present invention apparatus, including:

an interface, which is operative to communicate with a memory that includes multiple analog memory cells; and circuitry, which is coupled to hold a definition of an action to be applied to one or more groups of the memory cells in response to respective wear levels of the groups, to apply at least one pulse to a given group of the memory cells so as to cause the memory cells in the given group to assume respective storage values, to read the respective storage values from the memory cells in the given group after applying the pulse, to compute one or more statistical properties of the read storage values, which are indicative of a wear level of the memory cells in the given group, and to apply the action responsively to the computed statistical properties.

The present invention will be more fully understood from the following detailed description of the embodiments thereof, taken together with the drawings in which:

DETAILED DESCRIPTION OF EMBODIMENTS

Overview

The performance of some types of analog memory cells degrades with use (e.g., as a function of the number of programming and erasure cycles applied to the cells). This phenomenon is commonly referred to as cell wearing. In some cases, the storage capacity of the cells deteriorates as a function of their wear level. At some point, a certain group of cells may become unusable due to extensive wearing. When operating a memory device that is partitioned into groups of memory cells, it is often desirable to assess the wear levels of the different cell groups.

Embodiments of the present invention that are described hereinbelow provide improved methods and systems for estimating the wear levels of groups of analog memory cells, and for taking various actions based on the estimated wear levels. The methods and systems described herein use the fact that analog memory cells tend to respond differently to programming or erasure pulses depending on their wear levels. In other words, when a given pulse is applied to a group of memory cells having a low wear level and to another cell group having a high wear level, the statistical distribution of storage values in the two groups will differ considerably.

In some embodiments that are described in detail below, the wear level of a given group of cells is estimated by applying one or more pulses to the memory cells in the group. The pulses cause the memory cells to assume respective storage values having a certain statistical distribution. The storage values of the memory cells are then read, and one or more statistical properties (e.g., mean and/or variance) of the read storage values are computed. The wear level of the group of memory cells is estimated based on the computed statistical properties.

In some embodiments, a memory device is partitioned into multiple cell groups, such as erasure blocks. The above-mentioned estimation process is repeated for different groups of memory cells, to produce respective wear level estimates of the different cell groups. The wear level estimates can be used, for example, for allocating low-wear cell groups to storage of new data. Additionally or alternatively, parameters of writing and reading operations in a given cell group can be set or modified based on the estimated wear level of the group. Several examples of parameters that can be modified as a function of wear level are described herein. This technique can improve the storage density of the memory device and the performance of read and write operations.

The methods and systems described herein provide fast and reliable wear level estimation. In particular, the disclosed techniques eliminate the need to track and store the history of each cell group (e.g., the number of programming and erasure cycles applied to each group of cells). In some cases, such historical information is unavailable, even when the memory has been used before extensively. In other cases, storing and tracking the historical information complicates the management of the memory and takes up storage space. Thus, the disclosed methods and systems simplify the wear level estimation process and eliminates the need to allocate storage space for storing such history tracking information.

System Description

Figure 1:
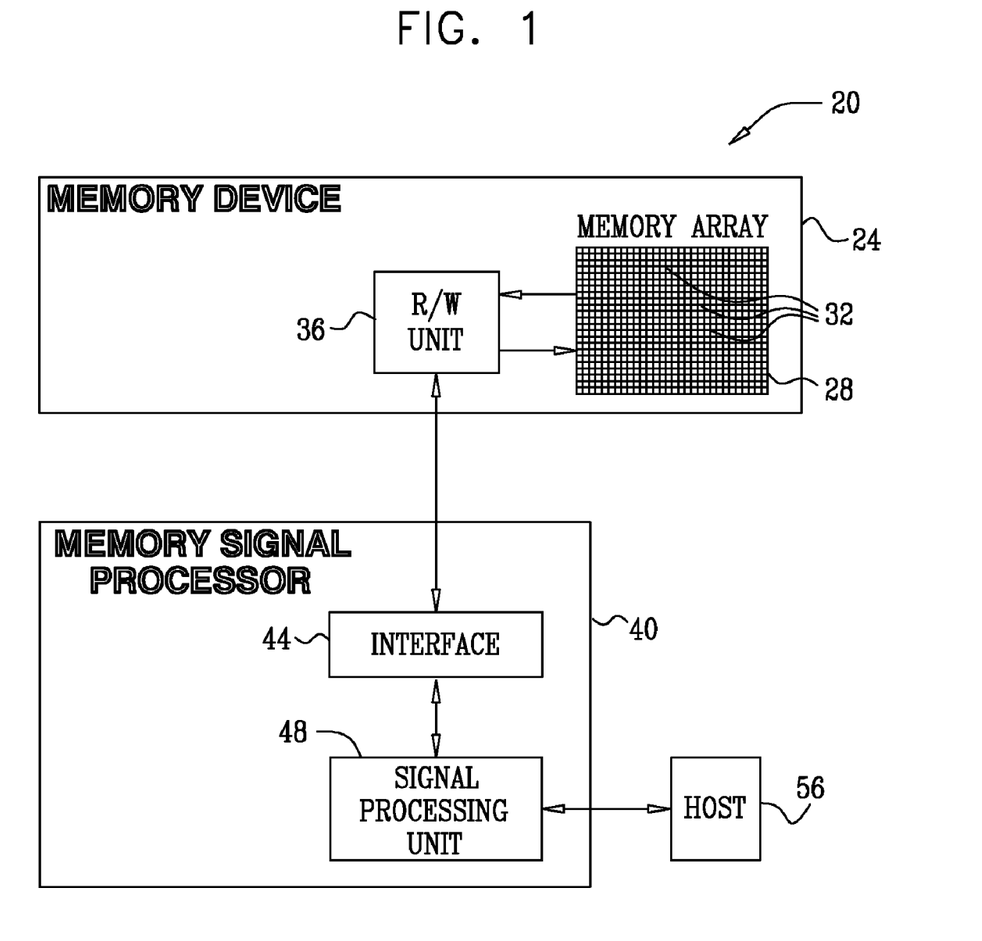
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory cell array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and CTF Flash cells, PCM, NROM, FRAM, MRAM and DRAM cells. Memory cells 32 may comprise Single-Level Cells (SLC) or Multi-Level Cells (MLC, also referred to as multi-bit cells).

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values to the cell.

Memory device 24 comprises a reading/writing (R/W) unit 36, which converts data for storage in the memory device to storage values and writes them into memory cells 32. In alternative embodiments, the R/W unit does not perform the conversion, but is provided with voltage samples, i.e., with the storage values for storage in the cells. The R/W unit typically (although not necessarily) programs the cells using an iterative Program and Verify (P&V) process, as is known in the art. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 produces the storage values for storing in the memory cells and provides these values to R/W unit 36. Alternatively, unit 48 provides the data for storage, and the conversion to storage values is carried out by the R/W unit internally to the memory device.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which the memory array is disposed. Further alternatively, some or all of the functionality of MSP 40 can be implemented in software and carried out by a processor or other element of the host system, or by a suitable memory controller. In some implementations, a single MSP 40 may be connected to multiple memory devices 24. In yet another embodiment, some or all of the MSP functionality may be carried out by a separate unit, referred to as a memory extension, which acts as a slave of memory device 24.

Typically, the MSP (or any other controller or processor that carries out some or all of the methods described herein) comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

Memory cells 32 of array 28 are typically arranged in a grid having multiple rows and columns, commonly referred to as word lines and bit lines, respectively. The array is typically divided into multiple pages, i.e., groups of memory cells that are programmed and read simultaneously. Cells are typically erased in groups of word lines that are referred to as erasure blocks.

In some embodiments, R/W unit 36 programs memory cells 32 using an iterative Program and Verify (P&V) process. In a typical P&V process, an entire memory page is written by applying a sequence of programming pulses to a group of memory cells that are mapped to this page. The amplitude of the programming pulses increases incrementally from pulse to pulse. The storage values programmed into the cells are read ("verified") after each pulse, and the iterations continue until the desired levels are reached.

Wear Level Assessment Based on Storage Value Distribution

The performance of analog memory cells often deteriorates as a function of their wear level, e.g., as a function of the number of Programming and Erasure (P/E) cycles applied to the cells. For example, in Flash memory, charge traps are formed in boundary regions between the cells as the cells are being used. These charge traps accumulate with use and gradually degrade the storage capacity of the memory cells. In some cases, a group of memory cells (e.g., a block) may become unusable after a certain number of P/E cycles.

In the context of the present patent application and in the claims, the term "wear level" refers to a measure of the cumulative amount of use of a memory cell or group of memory cells, or to a measure of the change in the performance of the cell or cells due to such use. For example, the wear level of a group of cells can be quantified as the number of P/E cycles applied to the cells since the memory device was manufactured. Alternatively, wear level can be measured or quantified using any other suitable means. In some cases, the wear level of a group of cells can actually improve over time.

For example, in Flash memory, when no P/E operations are performed on the cells for a long period of time, charge tends to escape from the charge traps. As a result, the wear level of cells may improve if the cells are not accessed for a long time period. The methods and systems described herein enable differentiating between cell groups that have gone through a similar number of P/E cycles, but which have different wear levels because they differ in the time that elapsed since the last P/E operations.

Assessing the wear level of different cell groups is important for operating the memory device. The assessment can be used, for example, for storing data in the cells in a manner that matches their wear-dependent performance. As another example, wear level estimation can be used to determine when a certain cell group is unusable and should be taken out of service.

Embodiments of the present invention provide improved methods and systems for estimating the wear levels of groups of analog memory cells, and to take action upon the estimated wear levels. The disclosed methods and systems use the fact that analog memory cells typically respond differently to programming or erasure operations, depending on their wear levels. In some embodiments that are described herein, MSP 40 estimates the wear level of a given group of cells 32 in memory device 24 by instructing R/W unit 36 to apply one or more programming or erasure pulses to the cells in the group. The MSP then reads the storage values assumed by the cells as a result of these pulses, and computes one or more statistical properties (e.g., mean and/or variance) of the read storage values. The statistical properties are typically indicative of the wear level of the cell group. The description that follows refers mainly to wear level estimation using positive programming pulses. Alternative techniques for wear level estimation using negative erasure pulses are provided further below.

Figure 2A:
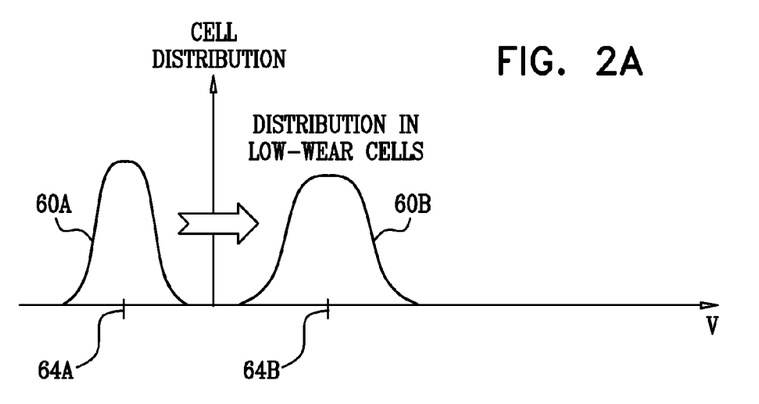
FIGS. 2A and 2B are graphs showing storage value distributions in groups of analog memory cells, in accordance with embodiments of the present invention.
Figure 2B:
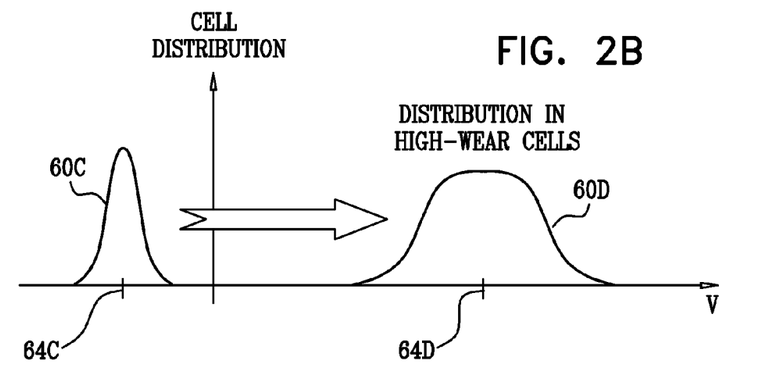

FIGS. 2A and 2B are graphs showing storage value distributions in groups of analog memory cells 32, in accordance with embodiments of the present invention. FIG. 2A shows the storage value distributions before and after applying a single programming pulse to a cell group having a relatively low wear level. FIG. 2B shows the distributions before and after applying a similar programming pulse to another cell group, which has a relatively high wear level. The two cell groups are assumed to be erased before applying the programming pulse. The characteristics of the programming pulse (e.g., its amplitude and duration) are assumed to be substantially the same for both cell groups.

In FIG. 2A, a distribution 60A represents the storage value distribution when the cells are at the erased level. In the present example, the erased cells have negative storage values that are distributed around a mean 64A. After applying the programming pulse, the cells in the low-wear group assume positive storage values, which are distributed according to a distribution 60B around a mean 64B.

In FIG. 2B, a distribution 60C shows the storage value distribution when the cells of the high-wear cell group are at the erased level, before applying the programming pulse. This distribution has a mean 64C. In the present example, although not necessarily, the storage value distribution of the erased cells differs from one group to the other. After the programming pulse is applied, the cells in the high-wear cell group assume positive storage values, which are distributed according to a distribution 60D around a mean 64D.

Comparing distribution 60B to distribution 60D demonstrates that the low-wear memory cells and the high-wear memory cells react differently to the programming pulse. As can be seen in FIGS. 2A and 2B, the statistical distribution of the storage values in the low-wear cell group after applying the programming pulse (distribution 60B) is distinctly different from the corresponding distribution in the high-wear cell group (distribution 60D). The storage value distribution in the high-wear cells typically has a larger variance and a higher mean, in comparison with the low-wear cell group. This sort of behavior is typical of Flash memory cells.

The dependence of the storage value distribution on wear level shown in FIGS. 2A and 2B is an exemplary dependence, which is chosen purely for the sake of conceptual clarity. The methods and systems described herein can be used with memory cells that respond differently to programming as a function of wear level in any other way.

Figure 3:
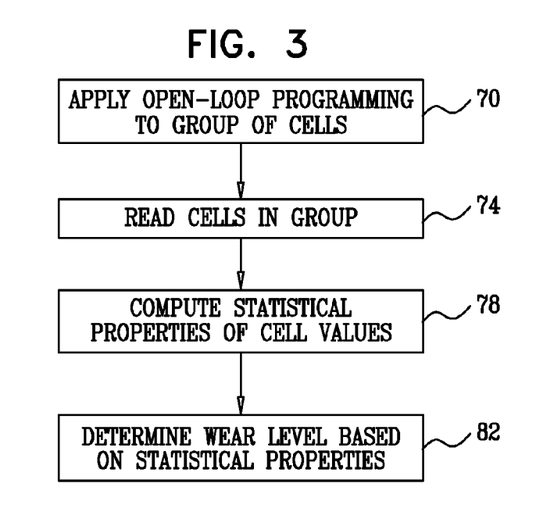
FIG. 3 is a flow chart that schematically illustrates a method for estimating a wear level of a group of analog memory cells, in accordance with an embodiment of the present invention.

FIG. 3 is a flow chart that schematically illustrates a method for estimating the wear level of a group of analog memory cells 32, e.g., of a given erasure block, in accordance with an embodiment of the present invention. The method begins with R/W unit 36 applying one or more open-loop programming pulses to the cells in the group, at a programming step 70. Typically, the R/W unit receives a command from MSP 40 to apply the pulses. In a typical implementation, the programming pulse applies to the word line in question a voltage in the range of 10-25V (e.g., 18V) for a duration of approximately 30 µS. Alternatively, however, any other suitable values can be used.

The term "open-loop" refers to the fact that no closed-loop verification is applied to the cells at this stage. Unlike Program and Verify (P&V) operation, in which pulses of different amplitudes are applied selectively to different cells in order to bring all cells to a target storage value, the purpose of step 70 is to deliberately differentiate between cells that react differently to programming pulses. Therefore, the R/W unit applies pulses having similar amplitudes to the different cells in the group. A technique that combines open-loop pulses with P&V programming of the cells is addressed further below.

The MSP reads the storage values from the memory cells in the group, at a reading step 74, and computes one or more statistical properties of the read storage values, at a statistics computation step 78. The MSP, using the R/W unit, typically performs one or more read operations, which compare the storage values of the cells to respective read thresholds. Based on the results of these read operations, the MSP estimates the statistical properties of the storage value distribution, such as the distribution mean and/or variance.

In some embodiments, the MSP performs rapid estimation by (1) applying a single programming pulse, (2) performing a single read operation, and (3) estimating the mean of the storage value distribution based on the results of the single read operation. The accuracy of estimating the statistical properties, however, typically depends on the number of read operations performed. Thus, in some embodiments, the MSP performs multiple read operations in order to assess the variance of the distribution and/or to estimate the mean more accurately.

Having computed the estimated statistical properties of the storage value distribution, the MSP estimates the wear level of the cell group as a function of the estimated statistical properties, at a wear level estimation step 82. In some embodiments, the MSP holds a predefined mapping between statistical property values and wear levels. For example, the predefined mapping may map mean and/or variance values of the storage values to respective numbers of P/E cycles. In these embodiments, the MSP determines the wear level value that best matches the estimated statistical properties of the cell group, in accordance with the predefined mapping. The mapping may be represented as a list, a look-up table, a function representation (e.g., a set of polynomial coefficients) or any other suitable representation.

As noted above, R/W unit 36 typically programs memory cells 32 using an iterative Program and Verify (P&V) process, in which the R/W unit applies to the cells a sequence of programming pulses that incrementally increase in amplitude. After each iteration, the R/W unit verifies the storage values assumed by the cells by reading the storage values and comparing them to one or more verify thresholds. At a given iteration, cells that have reached their target storage values are inhibited from receiving subsequent programming pulses, and programming continues for those cells that have not yet reached their intended storage values.

In some embodiments, the wear level estimation method of FIG. 3 can be combined as part of an iterative P&V process that stores data in the cells. For example, the MSP may use the programming pulse or pulses of the first P&V iteration as a sort of open-loop application of a programming pulse to the cells. Moreover, the MSP may use the first verification operation of the P&V process as a read operation, and compute the statistical properties of the storage value distribution based on the read results of the first P&V iteration. Moreover, the read results of subsequent P&V iterations can be used to further improve the accuracy of computing the statistical properties of the storage value distribution. For example, after a certain number of P&V iterations, the MSP may select a group of cells that received the same number of programming pulses and compute the statistical properties over the storage values of these cells.

The description of FIG. 3 above refers to a single group of cells. Typically, however, MSP 40 repeats the process of FIG. 3 in different cell groups, e.g., in different erasure blocks. As a result, the MSP may maintain a list of estimated wear levels of the different cell groups. The MSP can take various kinds of actions based on the estimated wear levels. For example, the MSP may give higher priority to low-wear blocks in storing data, in order to distribute cell wearing evenly among the different cell groups. The MSP may apply any suitable wear leveling technique, such as some of the techniques cited in the Background section above, for this purpose.

As another example, the MSP may define for each cell group one or more storage parameters, using which data is written to and/or read from the memory cells of the group. In some embodiments, the MSP sets the storage parameters of a given cell group based on the estimated wear level of the group. Using this technique, the writing and/or reading performance can be optimized in each cell group, according to the group's wear level.

Storage parameters that can be adapted based on wear level comprise, for example, values of read thresholds used in read operations and/or values of verify thresholds used in P&V programming operations. (Thus, the nominal storage values associated with the different programming levels, sometimes referred to as PV levels, may be adapted based on the wear level of the cells.) When data is stored in the cells using an iterative P&V process, the storage parameters may comprise various parameters of the P&V process, e.g., the initial amplitude of the programming pulses or the amplitude increment between successive programming pulses. Typically, low-wear cell groups can be programmed with rougher P&V parameters (e.g., a larger pulse increments or a smaller number of pulses), so as to improve programming speed. High-wear cells, on the other hand, should often be programmed more accurately in order to meet the desired data reliability.

On the other hand, since high-wear cells are typically more responsive to programming pulses, a smaller number of pulses may often be sufficient for programming them.

As another example, the MSP may modify the storage density at which data is stored in the cells of a given group based on the estimated wear level of the group. Low-wear cells can often be programmed to store data at a higher density, and vice versa. The MSP can modify the storage density in a given cell group, for example, by modifying the number of programming levels or by modifying an Error Correction Code (ECC) that is used for encoding the stored data.

In some embodiments, the MSP holds a predefined mapping between statistical properties and storage parameters. This mapping may specify the estimated wear levels corresponding to the different statistical property and storage parameter values. In some embodiments, however, the wear levels may not be specified explicitly, such that the statistical properties are mapped to storage parameters directly.

In some embodiments, the MSP adaptively modifies the mapping of statistical properties to storage parameters during operation. For example, consider a scenario in which a certain statistical property value X (e.g., mean) is mapped to a certain estimated wear level, which in turn is translated to the use of a certain PV level. If the MSP concludes, during operation, that this PV level is marginal, it may adjust the mapping, so as to map statistical property value X to a different PV level value.

Wear Level Estimation Based on the Storage Value Distribution of Erased Cells

In the embodiments described above, MSP 40 estimates the wear level of a given cell group by applying positive pulses, i.e., pulses that increase the storage values of the cells. In alternative embodiments, however, the wear level can also be estimated by applying negative pulses, i.e., pulses that decrease the storage values of the cells. In particular, the wear level can be estimated by examining the statistical properties of the storage values of erased cells, before, during and/or after an erasure operation.

Typically, R/W unit 36 erases a group of memory cells 32 (e.g., an entire erasure block) by applying one or more erasure pulses having negative voltages to the word lines of these cells. These erasure pulses cause the cells to assume negative storage values (e.g., threshold voltages). See, for example, distribution 60A in FIG. 2A and distribution 60C in FIG. 2B. In some embodiments, the R/W unit erases cells using an iterative process, which somewhat resembles the P&V processes described above. In such an erasure process, the R/W unit applies a sequence of erasure pulses to the cells of a given erasure block. The erasure is typically verified per bit line. In other words, the R/W unit determines whether a particular bit line is positive, i.e., contains one or more cells whose storage value has not turned negative. Typically, erasure pulses are applied to the block until the number of positive bit lines drops below a specified number. If this target is not reached after a specified number of erase pulses, the erasure operation is regarded as failed.

As already noted above, the responsiveness of memory cells to positive programming pulses is typically indicative of the wear level of the cells. In many practical cases, similar behavior applies to negative erasure pulses, as well. In other words, the statistical distribution of the erased cells is often indicative of the wear level of the cells. Thus, in some embodiments, MSP 40 estimates the wear level of a group of erased cells based on one or more statistical properties of the storage values of the cells in the group. These statistical properties can be computed during and/or following the erasure operation.

Since in many memory devices it is difficult to measure negative storage values, the MSP may calculate the statistical properties (e.g., mean or variance) after applying a small number of erasure pulses, e.g., after the first erasure pulse. At that point, many of the cells still have positive storage values, which can be assessed using conventional read operations. In some embodiments, the MSP reads the storage values of the cells after each erasure iteration. In some embodiments, the MSP reads the cells before initiating the erasure operation, so that the relative effect of each erasure pulse can be estimated. (Note that different memory cells may be programmed to different levels prior to erasure.)

Additionally or alternatively, the MSP may estimate the wear level based on different measures regarding the storage values and the erasure operation, such as the number of cells whose storage values is still positive after a given number of erasure iterations, or the number of iterations needed to cause a given percentage of the cells (e.g., 99%) to assume negative storage values.

In some embodiments, the memory device provides an erase verification indication for each bit line, indicating whether or not the cells along the bit line are properly erased. The MSP may use these indications to estimate the number of cells whose storage value is positive. Alternatively, the MSP may perform a read operation with a certain (typically small) non-negative read threshold value. The read threshold value can be modified from one erasure iteration to another.

In some embodiments, the MSP carries out the following procedure for estimating the wear level of a given cell group:

The MSP selects a subset of the cells that are programmed to a certain programming level, and computes one or more statistical properties of the storage values of these cells (e.g., mean and/or variance) prior to erasure.

After each erasure iteration, the MSP reads the cells in the subset and re-computes the statistical properties. In some embodiments, the MSP can shift the storage value distribution to become more positive (i.e., to cause a larger portion of the distribution to occupy positive values) by modifying the bias voltages that are applied to non-read word lines in the block.

The MSP estimates the wear level of the cell group based on the different statistical properties before, during and/ or after the erasure operation.

In some embodiments, the MSP may apply various techniques for estimating the storage value distribution of the cells after the erasure operation is completed. These embodiments typically involve assessing negative storage values. Several example techniques that can be used for this purpose are described in U.S. Patent Application Publication 2008/0181001, entitled "Memory Device with Negative Thresholds", and in U.S. patent application Ser. No. 12/251,471, entitled "Compensation for Voltage Drifts in Analog Memory Cells". Both of these patent applications are assigned to the assignee of the present patent application, and their disclosures are incorporated herein by reference.

For example, a negative storage value of a certain cell can sometimes be sensed by programming one or more neighboring cells to high storage values. The description that follows mainly addresses sensing of threshold voltages in NAND Flash cells, but this technique can also be used with other suitable memory cell types. The threshold voltages read from cells 32 are sometimes affected by the threshold voltages of other cells in the array. For example, the threshold voltage of a given cell may be affected by floating-gate coupling from neighboring cells, e.g., from horizontal neighbors on the same word line or from vertical neighbors on the same bit line. As another example, the memory cells in some NAND Flash devices are arranged in strings of cells that are connected in series, as is well-known in the art. The threshold voltage read from a given cell may be affected by the threshold voltages of other cells in the same NAND string.

In some embodiments, MSP 40 takes advantage of these effects in order to raise the negative threshold voltages of erased cells above zero, enabling the R/W unit to read these threshold voltages using conventional read operations. In some embodiments, the MSP programs one or more neighbors of a target erased cell to high values, in order to deliberately cause cross-coupling effects that would raise the threshold voltage of the target cell above 0V. For example, in order to sense the threshold voltages of the cells in a given word line, the MSP may program the cells in one or more neighboring word lines to high values (e.g., to the highest programming level supported by the memory device or to the maximum specified threshold voltage of the device). Typically, the MSP programs the neighboring word lines with high accuracy (e.g., with a high-resolution P&V process) in order to cause the threshold voltage distribution in the neighboring word lines to have a small variance.

Interface for Carrying Out Wear Level Estimation

In some embodiments, the MSP and the memory device support a command interface, which comprises commands that enable performing the wear level estimation methods described herein. For example, the command interface may comprise a command using which the MSP instructs the memory device to apply an open-loop pulse (or multiple open-loop pulses) to a specified group of cells.

In some embodiments, computation of the statistical properties of the storage value distribution is performed by circuitry internal to the memory device, and estimation of the wear level is performed by the MSP. In these embodiments, the command interface may comprise a command using which the memory device reports the computed statistical properties to the MSP. In alternative embodiments, the entire wear level estimation process is performed internally to the memory device. In these embodiments, the command interface may comprise a command using which the memory device reports the estimated wear level (e.g., the estimated number of P/E cycles) of a given cell group to the MSP. Alternatively, the memory device may report this value as part of a "program status" or an "erase status" message.

The command interface may be defined over the same physical interface (e.g., bus) that is used for data storage. Alternatively, the command interface may utilize a dedicated physical interface. Such a dedicated interface may be implemented in a number of ways. For example, the interface may comprise a bidirectional interface over which the MSP and memory device exchange commands and notifications with one another. Alternatively, the interface may comprise a unidirectional interface, which is directed from the memory device to the MSP. In these embodiments, the MSP can send commands to the memory device using the interface used for data storage, and receive notifications from the memory device over the dedicated unidirectional interface. In some embodiments, the unidirectional interface may comprise a logger, which logs the notifications and then outputs them continually or during predefined time periods, for example, during busy periods of the memory device. In addition to wear level-related information, the interface may be used for transmitting any other suitable kind of indications from the memory device to the MSP.

The dedicated command interface may be implemented using any suitable physical standard, such as UART, USB, FireWire. Typically, the interface utilizes a small number of pins, in order to reduce the overall pin count of the MSP and memory device. Further alternatively, the dedicated interface may comprise an analog signal interface. For example, the MSP may generate the open-loop pulses that are applied to the memory cells, and provide these pulses over an analog interface to the memory device.

In the embodiments described herein, the various wear level estimation functions are carried out by MSP 40 (or other controller that controls device 24). Alternatively, however, these functions can be carried out by elements internal to device 24 (e.g., by unit 36) and/or by elements external to the device (e.g., MSP 40). In the context of the present patent application and in the claims, these elements are referred to collectively as data storage circuitry, which is coupled to the memory and carries out the methods described herein. The disclosed methods can be partitioned among the different elements in any suitable way.

Although the embodiments described herein mainly address wear level estimation in solid state memory devices, the principles of the present invention can also be used for wear level estimation in other suitable storage media.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. Apparatus, comprising:
   a memory, which comprises multiple analog memory cells; and
   circuitry, which is coupled to apply at least one pulse to a group of the memory cells so as to cause the memory cells in the group to assume respective storage values, to read the respective storage values from the memory cells in the group after applying the pulse, to compute one or more statistical properties of the read storage values, and to estimate a wear level of the group of the memory cells responsively to the statistical properties,
   wherein the circuitry is coupled to set one or more parameters related to data storage in the group of the memory cells responsively to the estimated wear level, and
   wherein the parameters comprise at least one parameter type selected from a group of types consisting of a read threshold, a verify threshold, an initial pulse amplitude of a sequence of programming pulses that are used for storing data in the memory cells, and an increment between successive programming pulses in the sequence of the programming pulses.

2. The apparatus according to claim 1, wherein the circuitry is coupled to estimate the wear level by estimating a number of Programming and Erasure (P/E) cycles that were previously applied to the group of the memory cells.

3. The apparatus according to claim 1, wherein the circuitry is coupled to hold a predefined mapping between values of the statistical properties and respective wear levels, and to determine the wear level that best matches the computed statistical properties according to the predefined mapping.

4. The apparatus according to claim 1, wherein the circuitry is coupled to calculate at least one statistical property selected from a group of properties consisting of a mean and a variance of the read storage values.

5. The apparatus according to claim 1, wherein the circuitry is coupled to store data in the group of the analog memory cells by applying a sequence of Programming and Verification (P&V) operations to the memory cells in the group, to use a first programming operation in the sequence for applying the pulse, and to use a first verification operation in the sequence for reading the storage values.

6. The apparatus according to claim 1, wherein the circuitry is coupled to assess multiple wear levels of multiple respective groups of the memory cells, and to allocate at least one of the groups for storage of new data responsively to the assessed wear levels.

7. The apparatus according to claim 1, wherein the circuitry comprises a Read/Write (R/W) unit that is packaged in a memory device comprising the memory cells, and a memory controller that is separate from the memory device, and wherein the R/W unit and the memory controller are coupled to exchange a message related to estimation of the wear level.

8. The apparatus according to claim 7, wherein the memory controller is coupled to send to the R/W unit a command, which instructs the R/W unit to apply the pulse.

9. The apparatus according to claim 7, wherein the R/W unit is coupled to report the computed statistical properties to the memory controller.

10. The apparatus according to claim 7, wherein the R/W unit is coupled to report the estimated wear level to the memory controller.

11. Apparatus, comprising:
    a memory, which comprises multiple analog memory cells; and
    circuitry, which is coupled to apply at least one pulse to a group of the memory cells so as to cause the memory cells in the group to assume respective storage values, to read the respective storage values from the memory cells in the group after applying the pulse, to compute one or more statistical properties of the read storage values, and to estimate a wear level of the group of the memory cells responsively to the statistical properties,
    wherein the circuitry is coupled to set a data storage density in the group of the memory cells responsively to the estimated wear level, and
    wherein the circuitry is coupled to set the data storage density by selecting at least one property selected from a group of properties consisting of a number of programming levels and an Error Correction Code (ECC) used for data storage in the group.

12. Apparatus, comprising:
    a memory, which comprises multiple analog memory cells; and
    circuitry, which is coupled to apply at least one pulse to a group of the memory cells so as to cause the memory cells in the group to assume respective storage values, to read the respective storage values from the memory cells in the group after applying the pulse, to compute one or more statistical properties of the read storage values, and to estimate a wear level of the group of the memory cells responsively to the statistical properties,
    wherein the at least one pulse comprises one or more erasure pulses, and wherein the circuitry is coupled to apply the erasure pulses so as to cause at least some of the memory cells in the group to assume negative storage values.

13. The apparatus according to claim 12, wherein the circuitry is coupled to assess a portion of the memory cells in the group that have assumed the negative storage values responsively to a given number of the erasure pulses.

14. The apparatus according to claim 12, wherein the circuitry is coupled to count the erasure pulses needed to cause a given portion of the memory cells in the group to assume the negative storage values.

15. The apparatus according to claim 12, wherein the circuitry is coupled to compare the statistical properties before and after applying a given number of the erasure pulses.

16. The apparatus according to claim 12, wherein the circuitry is coupled to calculate the statistical properties for a subset of the memory cells in the group, which are initially programmed to a given programming level.

17. The apparatus according to claim 12, wherein the memory cells in the group belong to a given word line, and wherein the circuitry is coupled to cause at least some of the negative storage values to become positive by programming other memory cells, which belong to one or more word lines that neighbor the given word line.

18. Apparatus, comprising:
an interface, which is operative to communicate with a memory that includes multiple analog memory cells; and
circuitry, which is coupled to apply at least one pulse to a group of the memory cells so as to cause the memory cells in the group to assume respective storage values, to read the respective storage values from the memory cells in the group after applying the pulse, to compute one or more statistical properties of the read storage values, and to estimate a wear level of the group of the memory cells responsively to the statistical properties,
wherein the circuitry is coupled to set one or more parameters related to data storage in the group of the memory cells responsively to the estimated wear level, and
wherein the parameters comprise at least one parameter type selected from a group of types consisting of a read threshold, a verify threshold, an initial pulse amplitude of a sequence of programming pulses that are used for storing data in the memory cells, and an increment between successive programming pulses in the sequence of the programming pulses.

* * * * *